(12) United States Patent
Venkataraman et al.

(10) Patent No.: US 9,922,269 B2
(45) Date of Patent: Mar. 20, 2018

(54) METHOD AND SYSTEM FOR ITERATIVE DEFECT CLASSIFICATION

(71) Applicant: KLA-Tencor Corporation, Milpitas, CA (US)

(72) Inventors: Sankar Venkataraman, Milpitas, CA (US); Li He, San Jose, CA (US); John R. Jordan, III, Mountain View, CA (US); Oksen Baris, San Francisco, CA (US); Harsh Sinha, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 20 days.

(21) Appl. No.: 15/010,887

(22) Filed: Jan. 29, 2016

(65) Prior Publication Data

US 2016/0358041 A1     Dec. 8, 2016

Related U.S. Application Data

(60) Provisional application No. 62/171,898, filed on Jun. 5, 2015.

(51) Int. Cl.
*G06K 9/62* (2006.01)
*G06T 7/00* (2017.01)
*H01L 21/66* (2006.01)

(52) U.S. Cl.
CPC .......... *G06K 9/6254* (2013.01); *G06K 9/628* (2013.01); *G06K 9/6255* (2013.01);
(Continued)

(58) Field of Classification Search
CPC ......... G06T 7/0004; G06T 2207/20081; G06T 2207/30148; G01N 21/9501–21/9505; G06K 9/628–9/6282
See application file for complete search history.

(56) References Cited

U.S. PATENT DOCUMENTS 6,324,298 B1 * 11/2001 O'Dell ............... G01N 21/9501
                                                        257/E21.53
6,922,482 B1    7/2005 Ben-Porath
(Continued)

OTHER PUBLICATIONS

U.S. Appl. No. 14/749,316, filed Jun. 24, 2016, Li He et al.
(Continued)

*Primary Examiner* — Brian P Werner
(74) *Attorney, Agent, or Firm* — Suiter Swantz pc llo

(57) ABSTRACT

Defect classification includes acquiring one or more images of a specimen including multiple defects, grouping the defects into groups of defect types based on the attributes of the defects, receiving a signal from a user interface device indicative of a first manual classification of a selected number of defects from the groups, generating a classifier based on the first manual classification and the attributes of the defects, classifying, with the classifier, one or more defects not manually classified by the manual classification, identifying the defects classified by the classifier having the lowest confidence level, receiving a signal from the user interface device indicative of an additional manual classification of the defects having the lowest confidence level, determining whether the additional manual classification identifies one or more additional defect types not identified in the first manual classification, and iterating the procedure until no new defect types are found.

16 Claims, 2 Drawing Sheets

(52) U.S. Cl.
CPC ......... *G06K 9/6269* (2013.01); *G06K 9/6282* (2013.01); *G06T 7/0004* (2013.01); *H01L 22/00* (2013.01); *G06T 2207/10061* (2013.01); *G06T 2207/20081* (2013.01); *G06T 2207/30148* (2013.01)

(56) References Cited

U.S. PATENT DOCUMENTS

| | | | |
|---|---|---|---|
| 7,602,962 | B2 | 10/2009 | Miyamoto et al. |
| 9,607,233 | B2* | 3/2017 | Kaizerman ............ G06K 9/033 |
| 2004/0156540 | A1* | 8/2004 | Gao ...................... G06T 7/0004 382/145 |
| 2012/0027286 | A1 | 2/2012 | Xu et al. |
| 2012/0045120 | A1* | 2/2012 | Tate ..................... G06K 9/6282 382/159 |
| 2012/0323506 | A1 | 12/2012 | King |
| 2013/0279794 | A1 | 10/2013 | Greenberg et al. |
| 2013/0300900 | A1 | 11/2013 | Pfister et al. |
| 2015/0356719 | A9* | 12/2015 | Geshel ................. G06T 7/0006 382/149 |

OTHER PUBLICATIONS

Leo Breiman, Machine Learning, Random Forests, Oct. 2001, pp. 5-32, vol. 45, Issue 1, Kluwer Academic Publishers, The Netherlands.

Kulkarni et al., Random Forest Classifiers: A Survey and Future Research Directions, International Journal of Advanced Computing, Apr. 2013, vol. 36, Issue 1, Recent Science Publications.

Xie et al., Detection and Classification of Defect Patterns in Optical Inspection Using Support Vector Machines, Intelligent Computing Theories Lecture Notes in Computer Science, vol. 7995, pp. 376-384, Jul. 2013.

PCT Search Report for Application No. PCT/US16/035466 dated Sep. 9, 2016, 3 pages.

* cited by examiner

METHOD AND SYSTEM FOR ITERATIVE DEFECT CLASSIFICATION

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional patent application entitled ITERATIVE DEFECT CLASSIFICATION STRATEGY, naming Sankar Venkataraman, Li He, John Jordan, Oksen Baris and Harsh Sinha as inventors, filed Jun. 5, 2015 Application Ser. No. 62/171,898. Application Ser. No. 62/171,898 is incorporated herein by reference in its entirety.

TECHNICAL FIELD

The present invention generally relates to defect review and classification, and, in particular, to iterative defect classification.

BACKGROUND

Fabricating semiconductor devices such as logic and memory devices typically includes processing a substrate, such as a semiconductor wafer, using a large number of semiconductor fabrication processes to form various features and multiple levels of the semiconductor devices. As semiconductor device size becomes smaller and smaller, it becomes critical to develop enhanced inspection and review devices and procedures. One such procedure includes classification and analysis of defects on a specimen, such as a wafer. As used throughout the present disclosure, the term "wafer" generally refers to substrates formed of a semiconductor or non-semiconductor material. For example, a semiconductor or non-semiconductor material may include, but are not limited to, monocrystalline silicon, gallium arsenide, and indium phosphide.

Defect review is a process by which a user reviews defects acquired by an inspector or inspection tool. Defect review requires the classification of defects and the differentiation, or separation of defect types based on a set of defect attributes. However, current defect classification approaches have a number of limitations. Prior approaches involve the visual analysis of one or more scanning electron microscope (SEM) images to assign a class code based on the type of defect observed during the human review process. Such a manual review and classification process suffers from a number of disadvantages. First, it is noted that typically images are classified at less than 1000 defects per hour by user. Given that a typical sample size can be greater than 4000 defects, the manual classification process is slow. In addition, this process is user intensive and is susceptible to human error.

As such, it would be advantageous to provide a system and method that provides improved defect classification that cures the shortfalls identified above.

SUMMARY

A method for iterative defect classification is disclosed, in accordance with one or more illustrative embodiments of the present disclosure. In one embodiment, the method includes acquiring one or more images of a specimen, the one or more images including a plurality of defects. In another embodiment, the method includes grouping each of at least a portion of the plurality of defects into one of two or more groups of defect types based on one or more attributes of the defects. In another embodiment, the method includes receiving a signal from a user interface device indicative of a first manual classification of a selected number of defects from each of the two or more groups of defect types. In another embodiment, the method includes generating a classifier based on the received first manual classification and the attributes of the defects. In another embodiment, the method includes classifying, with the classifier, one or more defects not manually classified by the manual classification. In another embodiment, the method includes identifying a selected number of defects classified by the classifier having the lowest confidence level. In another embodiment, the method includes receiving a signal from the user interface device indicative of an additional manual classification of the selected number of the defects having the lowest confidence level. In another embodiment, the method includes determining whether the additional manual classification identifies one or more additional defect types not identified in the first manual classification. In another embodiment, responsive to the identification by the additional manual classification of one or more defect types not identified by the first manual classification, the method generates an additional classifier and repeats the classification and analysis process.

An apparatus for iterative defect classification is disclosed, in accordance with one or more illustrative embodiments of the present disclosure. In one embodiment, the apparatus includes an inspection tool. In another embodiment, the inspection tool includes one or more detectors configured to acquire one or more images of at least a portion of a specimen. In another embodiment, the apparatus includes a user interface device. In another embodiment, the apparatus includes a controller. In one embodiment, the controller includes one or more processors communicatively coupled to the one or more detectors of the inspection tool, wherein the one or more processors are configured to execute a set of program instructions stored in memory. In one embodiment, the set of program instructions are configured to cause the one or more processors to receive the one or more images from the one or more detectors of the inspection tool. In another embodiment, the set of program instructions are configured to cause the one or more processors to group each of at least a portion of the plurality of defects into one of two or more groups of defect types based on one or more attributes of the defects. In another embodiment, the set of program instructions are configured to cause the one or more processors to receive a signal from a user interface device indicative of a first manual classification of a selected number of defects from each of the two or more groups of defect types. In another embodiment, the set of program instructions are configured to cause the one or more processors to generate a classifier based on the received first manual classification and the attributes of the defects. In another embodiment, the set of program instructions are configured to cause the one or more processors to classify, with the classifier, one or more defects not manually classified by the manual classification. In another embodiment, the set of program instructions are configured to cause the one or more processors to identify a selected number of defects classified by the classifier having the lowest confidence level. In another embodiment, the set of program instructions are configured to cause the one or more processors to receive a signal from the user interface device indicative of an additional manual classification of the selected number of the defects having the lowest confidence level. In another embodiment, the set of program instructions are configured to cause the one or more processors to determine whether the additional manual classification identifies one or more additional defect types not identified in the first manual classification. In another embodiment, responsive to the identification by the additional manual classification of one or more defect types not identified by the first manual classification, the set of program instructions cause the one or more processors to generate an additional classifier and repeat the classification and analysis process.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Figure 1:
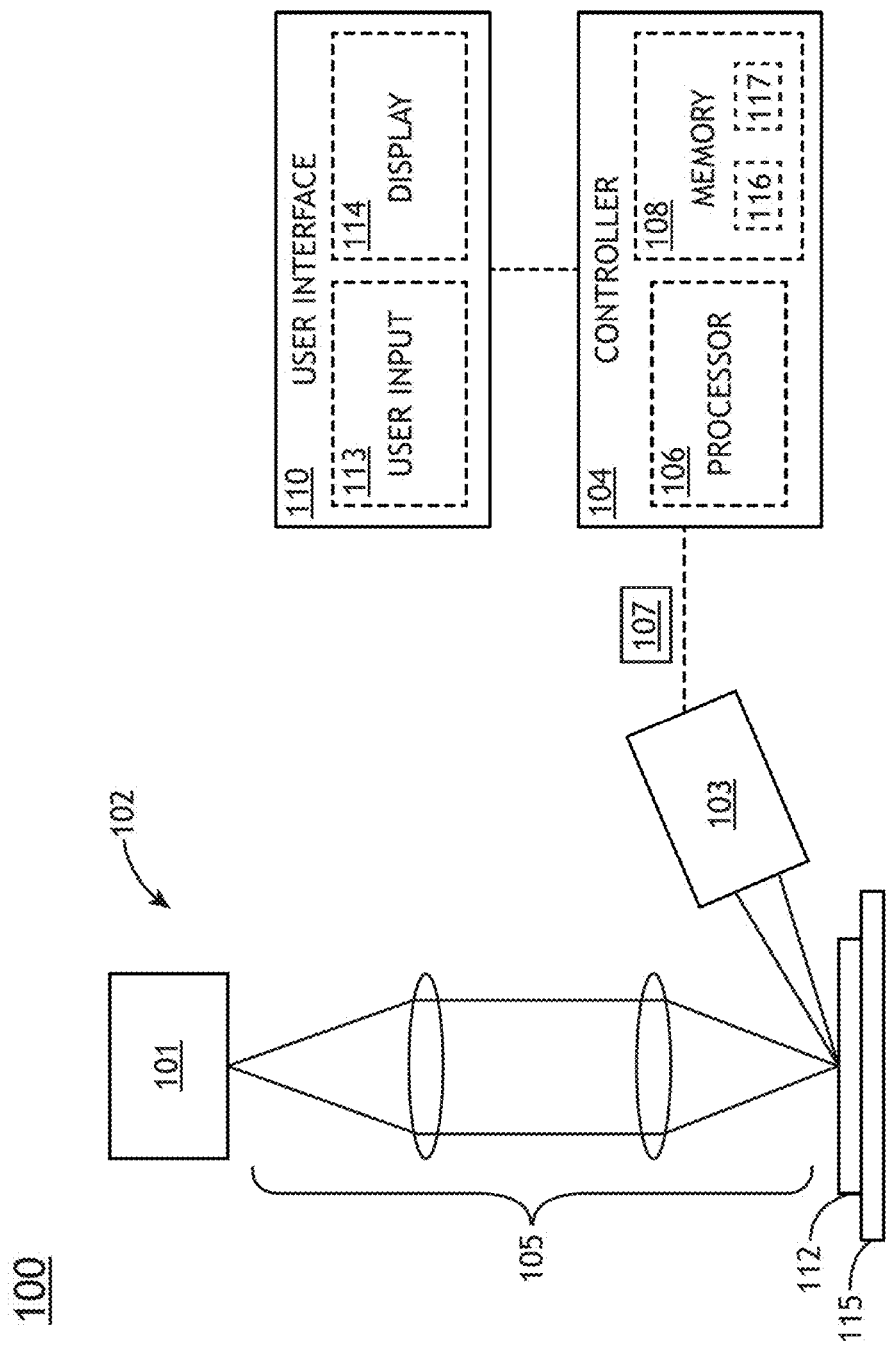
FIG. 1 is a block diagram view of a system for defect classification and analysis, in accordance with one embodiment of the present disclosure.
Figure 2:
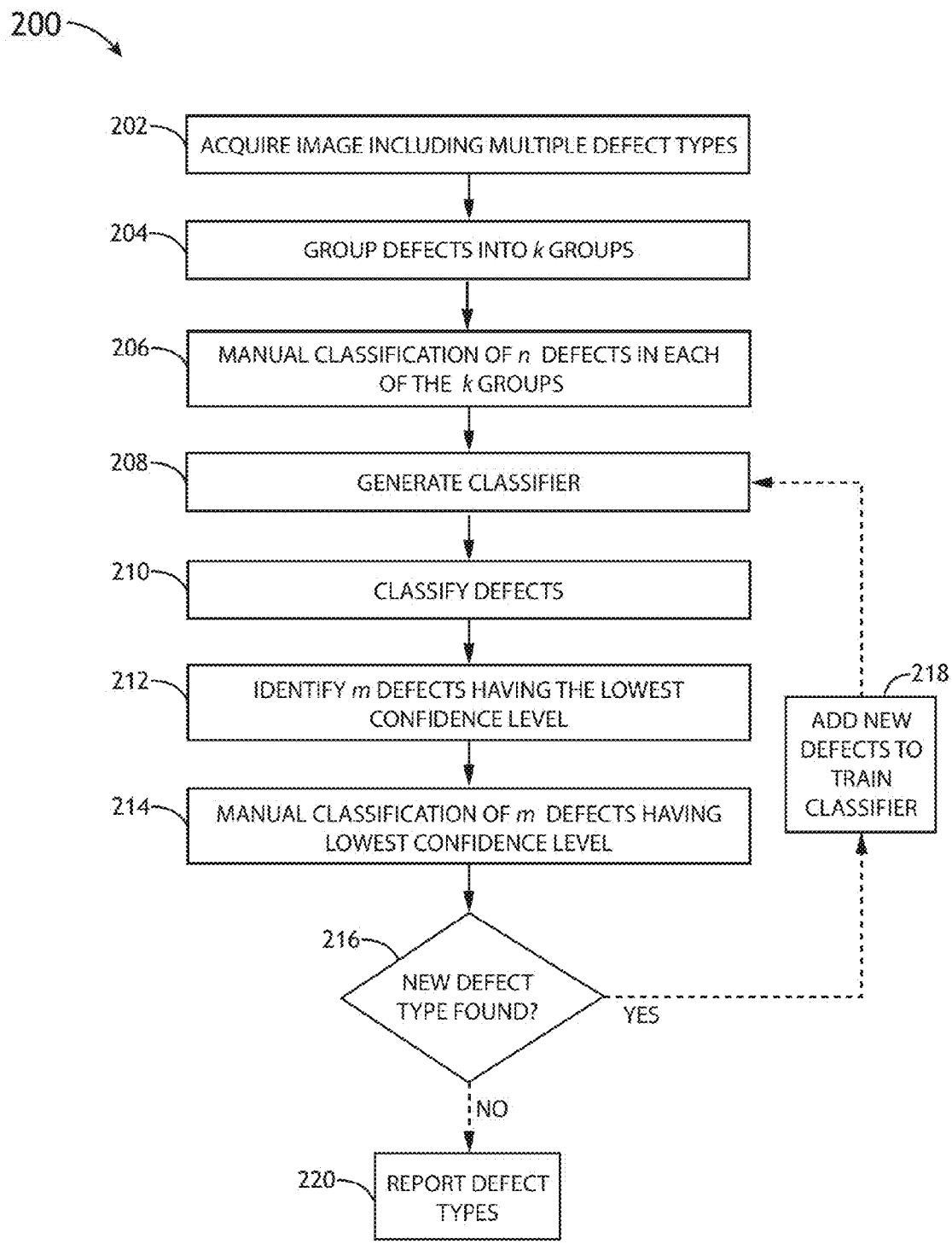
FIG. 2 is a flow diagram illustrating steps performed in a method for defect classification, in accordance with one embodiment of the present disclosure.

Referring generally to FIGS. 1 through 2, a method and system for defect classification and analysis are described in accordance with the present disclosure. Embodiments of the present disclosure are directed to high-confidence determination of the defect types present in imagery data of a sample through the classification of a subset of the available defects.

Embodiments of the present disclosure utilize defect attributes to provide user with a subset of diverse defects. For each defect type a small portion of defects are manually classified by a user. Based on the manual classification, an automated defect classification model, or classifier, is generated. The classifier then classifies the entire sample set. Additional embodiments provide the user with an additional even smaller portion of defects which are identified as the lowest confidence defects from the initial automatic classification. Once the lowest confidence defects are identified, these defects undergo an additional manual classification by the user. In the event new defect types are discovered in the additional manual classification, a new classifier may be generated using the results of the first and additional manual classification. With each iteration, the classification confidence increases. With sufficient iteration all defect types are expected to be determined with the classification confidence of all defects exceeding a selected threshold.

Defect classification is generally described by Li He et al. in U.S. patent application Ser. No. 14/749,316, filed on Jun. 24, 2015, which is incorporated herein by reference in the entirety.

FIG. 1 illustrates a conceptual block diagram view of a system 100 for defect classification and analysis, in accordance with one or more embodiments of the present disclosure. In one embodiment, the system 100 includes an inspection tool 102. In one embodiment, the inspection tool 102 is configured to measure one or more characteristics of one or more defects disposed on or in the surface of a specimen, such as, but not limited to, a semiconductor wafer (e.g., Si wafer).

The inspect tool 102 may include any inspection configuration known in the art capable of defect review and classification. In one embodiment, as depicted in FIG. 1, the inspection tool 102 includes an e-beam defect review (EDR) tool. For example, as shown in FIG. 1, the inspection tool 102 includes an electron source 101 (e.g., one or more electron guns to emit one or more electron beams), a detector 103 (e.g., secondary electron detector) and any one or more electron-optical components 105 known in the art for carrying out defect review.

It is noted herein that the scope of the present disclosure is not limited to the EDR configuration of system 100 or electron-beam review in general. In one embodiment, the inspection tool 102 may be configured as a light-based inspection tool. For example, the inspection tool 102 may be, but is not required to be, configured for darkfield inspection. By way of another example, the inspection tool 102 may be, but is not required to be, configured for brightfield inspection. In the case of light-based inspection, the inspection tool 102 may include one or more light sources to illuminate the specimen 112. The light source may include any light source known in the art. For example, the light source may include a narrow band light source, such as a laser source. By way of another example, the light source may include a broad band light source, such as a discharge lamp or a laser-sustained plasma (LSP) light source. In another embodiment, the light source may be configured to direct light to the surface of the specimen 112 (via various optical components) disposed on the sample stage 115. Further, the various optical components of the inspection tool 102 are configured to direct light reflected, scattered, and/or diffracted from the surface of the wafer 112 to a detector (not shown) of the inspection tool 102. The detector may include any appropriate light detector known in the art. In one embodiment, the detector may include, but is not limited to, a charge coupled device (CCD) detector, a photomultiplier tube (PMT) detector, and the like.

It is noted that for purposes of simplicity the inspection tool 102 has been depicted in a simplified block diagram. This depiction, including the components and geometrical configuration, is not limiting and is provided for illustrative purposes only. It is recognized herein that the inspection tool 102 may include any number of optical elements (e.g., lenses, mirrors, filters beam splitter and the like), energy sources (e.g., light source or electron source) and detectors (e.g., light detector or electron detector, such as a secondary electron detector) to carry out the inspection of one or more portions of wafer 112 disposed on the sample stage 115.

In another embodiment, the system 100 includes a controller 104. In one embodiment, the controller 104 is communicatively coupled to the inspection tool 102. For example, the controller 104 may be coupled to the output of detector 103 of the inspection tool 102. The controller 104 may be coupled to the detector in any suitable manner (e.g., by one or more transmission media indicated by the line shown in FIG. 1) such that the controller 104 can receive the output generated by the inspection tool 102.

In one embodiment, the controller 104 includes one or more processors 106 communicatively coupled to the detector 103 and memory 108. In one embodiment, the one or more processors 106 are configured to execute a set of program instructions 116 maintained in memory 108.

The one or more processors 106 of controller 104 may include any one or more processing elements known in the art. In this sense, the one or more processors 106 may include any microprocessor device configured to execute algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium (e.g., memory 108). Moreover, different subsystems of the system 100 (e.g., inspection tool, display or user interface 110) may include processor or logic elements suitable for carrying out at least a portion of the steps described throughout the present disclosure. Therefore, the above description should not be interpreted as a limitation on the present invention but merely an illustration.

The memory medium 108 may include any storage medium known in the art suitable for storing program instructions executable by the associated one or more processors 106. For example, the memory medium 108 may include a non-transitory memory medium. For instance, the memory medium 108 may include, but is not limited to, a read-only memory, a random access memory, a magnetic or optical memory device (e.g., disk), a magnetic tape, a solid state drive and the like. In another embodiment, it is noted herein that the memory 108 is configured to store one or more results from the inspection tool 102 and/or the output of the various steps described herein. It is further noted that memory 108 may be housed in a common controller housing with the one or more processors 106. In an alternative embodiment, the memory 108 may be located remotely with respect to the physical location of the processors and controller 104. For instance, the one or more processors 106 of controller 104 may access a remote memory (e.g., server), accessible through a network (e.g., internet, intranet and the like). In another embodiment, the memory medium 108 stores the program instructions 116 for causing the one or more processors 106 to carry out the various steps described through the present disclosure.

In another embodiment, the controller 104 of the system 100 may be configured to receive and/or acquire data or information from other systems (e.g., inspection results from an inspection system or metrology results from a metrology system) by a transmission medium that may include wireline and/or wireless portions. In another embodiment, the controller 104 of the system 100 may be configured to transmit data or information (e.g., the output of one or more processes disclosed herein) to one or more systems or subsystems (e.g., inspection system or metrology system) by a transmission medium that may include wireline and/or wireless portions. In this manner, the transmission medium may serve as a data link between the controller 104 and other subsystems of the system 100. Moreover, the controller 104 may send data to external systems via a transmission medium (e.g., network connection).

In another embodiment, the system 100 includes a user interface 110. In one embodiment, the user interface 110 is communicatively coupled to the one or more processors 106 of controller 104. In another embodiment, the user interface device 110 may be utilized by controller 104 to accept selections and/or instructions from a user. In some embodiments, described further herein, a display 114 may be used to display data to a user (not shown). In turn, a user may input, via user input device 113, a selection and/or instructions responsive to data displayed to the user via the display device 114.

The user interface device 110 may include any user interface known in the art. For example, the user input device 113 of the user interface 110 may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like. In the case of a touchscreen interface device, those skilled in the art should recognize that a large number of touchscreen interface devices may be suitable for implementation in the present invention. For instance, the display device 114 may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device 113 may include, but is not limited to, a bezel mounted interface.

The display device 114 may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user input device (e.g., touchscreen, bezel mounted interface, keyboard, mouse, trackpad, and the like) is suitable for implementation in the present invention.

In one embodiment, the one or more processors 106 of controller 104 are programmed to carry out one or more steps of an iterative defect classification procedure as described below. The embodiments of the system 100 illustrated in FIG. 1 may be further configured as described herein. In addition, the system 100 may be configured to perform any other step(s) of any of the method embodiment(s) described herein.

FIG. 2 is a flow diagram illustrating steps performed in a method 200 of defect classification, in accordance with one embodiment of the present disclosure. It is noted herein that the steps of method 200 may be implemented all or in part by the system 100. It is further recognized, however, that the method 200 is not limited to the system 100 in that additional or alternative system-level embodiments may carry out all or part of the steps of method 200.

In step 202, one or more images 107 of a specimen including multiple defects are acquired. The one or more defects consist of multiple defect types. For example, the types of defects contained on or in the specimen may include, but are not limited to, a particle defect, a residue defect, a void or scratch defect, a bump or protrusion defect, a bridge defect and the like. In one embodiment, the inspection tool 102 acquires the one or more images 107 and transmits the one or more images 107 to the one or more the controller 104. It is further contemplated that the one or more images 107 may be stored in memory 108 and used for later analysis.

In step 204, at least a portion of the defects are grouped into one of multiple defect-type groups. In one embodiment, the defects are grouped by the one or more processors 106 of controller 104 into the multiple defect-type groups according to one or more attributes of the defects such that like defects are grouped in the same grouping. For example, the defects may be grouped into k-number of defect-type groups, where k is between 2 and 100. For instance, the defects acquired in image 107 may be grouped into 10 different defect-type groupings. Further, it is recognized herein that the grouping of defect data into k groups may be carried out by distributing and storing the defect data into a set of k folders maintained in memory 108 (or another memory).

In one embodiment, the attributes of the defects in the one or more images 107 may be processed by an automatic classification procedure, such as, but not limited to, a real-time automatic classification (RT-ADC) procedure to classify the defects. It is noted that the utilization of RT-ADC provides for a "rough" automatic classification of defects without sacrificing high processing speeds. Real-time automatic classification is described generally in U.S. Pat. No. 7,602,962, issued on Oct. 13, 2009, which is incorporated above by reference in the entirety. It is noted herein that any type of auto grouping algorithm may be used to automatically classify and group the defects of the one or more images 107. For example, the automatic grouping algorithm may include, but is not limited to, a centroid-based clustering procedure (e.g., k-mean grouping algorithm). By way of another example, the automatic grouping algorithm may include, but is not limited to, a connectivity-based clustering procedure (e.g., hierarchical clustering algorithm). By way of another example, the automatic grouping algorithm may include, but is not limited to, a distribution-based clustering procedure (e.g., expectation-maximization (EM) algorithm).

The one or more attributes using for grouping defects may include, but are not limited to, image feature amounts, defect coordinates, composition analysis results, manufacture initiation history data, or machine QC (Quality Control) data. Further, the one or more attributes may be obtained from multiple types of defect inspection tools or systems, such as, but not limited to, an optical or SEM foreign matter inspection machine, a pattern inspection machine, a defect review machine, SPM, or an elemental analysis machine. Attributes suitable for classification of defects is described in U.S. Pat. No. 7,602,962, issued on Oct. 13, 2009, which is incorporated herein by reference in the entirety.

In step 206, a first manual classification of a selected number of defects from each of the k groups of defect-types is carried out. For example, a user may manually classify a selected number of defects contained in each of the k defect-type groups from the acquired one or more images 107. In one embodiment, n-number of defects are automatically selected by one or more processors 106 of controller 104 from each of the k groups of defects found in step 204. For example, the controller 104 may automatically select n defects from each of the k-number of defect-type groups, where n is between 2 and 100. For instance, the controller 104 may select 50 defects from each of the defect-type groups for manual classification.

In another embodiment, the one or more processors 106 of controller 104 may display the selected n defects from each defect-type group on display 114 of the user interface device 110. In turn, the user may manually classify the n defects from each of the k defect-type groups via user input 114 of user interface device 110 based on one or more attributes of the one or more defects. The user interface device 110 may then transmit a signal indicative of a manual classification of the defects of the specimen 112 to the controller 104. In another embodiment, the controller 104 may receive the manual classification of the defects and store the result in memory 108. The one or more attributes used to carry out the classification of step 206 include any one or more attributes that can be derived from a defect inspection or review tool, as noted above.

In step 208, a first classifier 117 is generated. In one embodiment, the first classifier 117 is generated, or trained, based on the first manual classification of defects of step 206 and the one or more associated attributes. In one embodiment, the one or more processors 106 of controller 104 may generate, or train, the first classifier 117 and store the first classifier 117 in memory 108. In one embodiment, the first classifier includes an ensemble learning classifier. For example, the ensemble learning classifier may include a random forest classifier. For instance, the one or more processors 106 may train a random forest classifier that operates by constructing multiple decision trees during a training period and outputting a class that is the mode of the classes of the individual trees. In this regard, the one or more processors 106 may use the manual classification of the defects and the associated attributes to train a random forest classifier. The implementation of a random forest classifier is described generally by Breiman in *Random Forests*, Machine Learning, Vol. 45, Issue 1, pp. 5-32 (2001), which is incorporated herein by reference in the entirety. Random forests are also discussed by Kulkarni et al. in *Random Forest Classifiers: A Survey and Future Research Directions*, International Journal of Advanced Computing, Vol. 36, Issue 1, pp. 1144-1153 (2013), which is incorporated herein by reference in the entirety.

By way of another example, the ensemble learning classifier includes a support vector machine (SVM). The one or more processors 106 may use the first manual classification of the defects and the associated attributes to train a SVM-based classifier. The implementation of a SVM-based classifier is described generally by Xie et al. in *Detection and Classification of Defect Patterns in Optical Inspection Using Support Vector Machines*, Intelligent Computing Theories Lecture Notes in Computer Science, Vol. 7995, pp. 376-384 (2013), which is incorporated herein by reference in the entirety.

It is noted herein that the classifier generated in step 208 may include any classifier known in the art and is not limited to an ensemble learning classifier. For example, the generated classifier may include a single decision tree classifier or multiple decision tree classifiers (e.g., super classifier).

Classifier generation is described in U.S. application Ser. No. 14/749,316, which is incorporated previously herein by reference in the entirety.

In step 210, one or more defects are classified with the first classifier 117. In one embodiment, the one or more processors 106 may retrieve the first classifier 117 stored in memory 108 (see step 208) and apply the first classifier 117 to one or more of the remaining defects not manually classified in step 206. In this regard, once the first classifier has been trained in step 208 it may then be used to classify one or more defects contained in the imagery data acquired from a given sample that were not manually classified in step 206.

In step 212, a selected number of defects, classified by the first classifier, having the lowest confidence level are identified. For example, a confidence level is calculated for all or a portion of the defects classified by the first classifier. It is noted herein that the confidence level of the classification for the one or more defects may be calculated in any manner known in the art. In one embodiment, the one or more processors 106 calculate the confidence level of the one or more defects via a voting procedure. For example, in the case where the first classifier 117 is a random forest classifier, each tree of the random forest classifier has a classification output referred to herein as a "vote." In this case, the confidence level for the one or more defects classified by the first classifier 117 may be, but is not required to be, calculated via a majority two vote scheme given by:

$$\text{Confidence} = \frac{\text{Majority Vote}}{\text{Sum of Major Two Vote}} \sqrt{\frac{\text{Sum of Major Two Vote}}{\text{Total Vote}}}$$

In another embodiment, after the confidence level is calculated for the defects classified by the first classifier, the one or more processors 106 of controller 104 may identify the m defects having the lowest confidence level. In one embodiment, the number of defects having the lowest confidence level may correspond to a number (e.g., N defects having lowest confidence level) pre-selected by a user via user interface 110. In this regard, the one or more processors 106 may select the N defects (e.g., 1-50 defects) having the lowest confidence level. In another embodiment, the number of defects having the lowest confidence level may correspond to a percentage of total defects (e.g., lowest P % of defects in terms of confidence level) pre-selected by a user via user interface 110. In this regard, the one or more processors 106 may select the P % of defects (e.g., lowest 10% of defects) having the lowest confidence level.

It is noted herein that any number of the classified defects may be identified as the defects with the lowest confidence level. For example, between 1 and 50 of the lowest confidence level defects may be selected by the controller 104.

Alternatively, the number (or percentage) of the defects identified as the lowest confidence level defects may be a function of a selected confidence level threshold. In this regard, a user may pre-select the threshold for adequate confidence in the classified defects. Defects that have a confidence level below this threshold are selected for additional classification, discussed further herein. For example, a confidence threshold for each defect type of the one or more defects may be generated. In one embodiment, the one or more processors 106 generate a confidence threshold for each defect type of the one or more defects based on a confidence threshold received from user interface 110. In another embodiment, the confidence threshold is generated by one or more processors 106 via a cross-validation procedure. In another embodiment, a user may select a purity requirement, or purity level, via user interface 110. In turn, the user interface device 110 may transmit a signal indicative of the selected purity requirement to the one or more processors 106 of controller 104. The controller 104 may then store the selected purity requirement in memory 108. It is noted herein that the received purity requirement may be a function of a variety of parameters. For instance, the received purity requirement may depend on a user preference and/or the expected defect types present on a given wafer.

For instance, a user may select a single classification purity requirement (e.g., 90%) on all defect types. In another instance, a user may select a first classification purity requirement (e.g., 90%) on a first defect type and a second classification purity requirement (e.g., 85%) on a second defect type and so on. It is further noted that in some embodiments a heightened purity requirement correlates to a higher confidence threshold. In this regard, the one or more processors 106 of controller 104 automatically adjust the confidence threshold in response to a user input via user interface 110.

The generation of a confidence level for defect type classification and the generation of a confidence threshold are described in U.S. patent application Ser. No. 14/749,316, which is incorporated previously herein by reference in the entirety.

In step 214, an additional manual classification of the selected number of the lowest confidence defects classified by the first classifier 117 is carried out. For example, after the m defects having the lowest confidence level are identified in step 212, a user may manually classify the m defects having the lowest confidence level.

In one embodiment, the controller 104 may display the m defects having the lowest confidence level on display 114 of the user interface device 110. In another embodiment, the user may manually classify the m defects having the lowest confidence level via user input 114 of user interface device 110 based on one or more attributes of the one or more defects. In turn, the user interface device 110 may transmit a signal indicative of a manual classification of the m defects having the lowest confidence level to the controller 104. In another embodiment, the controller 104 may receive the manual classification of the m defects having the lowest confidence level and store the result in memory 108. The one or more attributes used to carry out the classification of step 214 include any one or more attributes that can be derived from a defect inspection or review tool, as noted above.

In step 216, it is determined whether the additional manual classification of step 212 identifies one or more additional defect types not identified in the first manual classification of step 206. For example, the one or more processors 106 of controller 104 may compare the first set of defect types identified in the first manual classification (step 206) to the defect types of the additional manual classification (step 214). In the event that the defect types identified in the additional manual classification do not match the defect types identified in the first manual classification of step 206 it is determined that additional defect types are present.

In the case where one or more new defect types are found by step 216, the process moves to step 218. In step 218, the newly identified defect types are added to the n defects manually classified in step 206 and the process repeats steps 208-216. In this regard, the additional defect types classified by the additional manual classification are combined with the n defects classified by the first manual classification of step 206. Then, the combined set of defect types undergoes steps 208-216.

For example, step 208 may be repeated, whereby a new classifier is generated using the n defects found in step 206 and the new defects found in step 216. Similarly, steps 210-216 may be repeated using the new classifier. This process may be repeated for any number of iterations (e.g., 1-10). It is noted that with each iteration of steps 208-216 the classification confidence level calculated in step 212 increases. The process may continue to be iterated until the classification confidence level for each (or at least some) of the defect types exceeds a selected confidence level.

In the case where new defect types are not found by step 216, the process moves to step 220. In step 220, the defect types found in each iteration are collected and reported. For example, the classified defect types may be reported to the user interface 110. By way of another example, the classified defect types may be reported to memory 108. By way of another example, the classified defect types may be reported to a remote memory (e.g., memory of remote computer or server). By way of another example, the classified defect types may be reported to an additional optical analysis tool (e.g., inspection tool, review tool, metrology tool and the like) communicatively coupled to the inspection tool 100. By way of another example, the classified defect types may be reported to one or more control systems of the associated device (e.g., semiconductor device) fabrication line. In one embodiment, the information associated with the classification of the defect types of sample 112 may be used to adjust one or more downstream process tool parameters to mitigate the impact of the presence of the classified defect types. In another embodiment, the information associated with the classification of the defect types of sample 112 may be used to adjust one or more upstream process tool parameters to reduce the formation of the particular defect types classified in method 200 in subsequent wafers processed by the process tool(s) of the fabrication line.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A method for defect classification comprising:
   acquiring one or more images of a specimen, the one or more images including a plurality of defects;
   grouping each of at least a portion of the plurality of defects into one of two or more groups of defect types based on one or more attributes of the defects;
   receiving a signal from a user interface device indicative of a first manual classification of a selected number of defects from each of the two or more groups of defect types;
   generating a classifier based on the received first manual classification and the attributes of the defects;
   classifying, with the classifier, at least some of the plurality of defects;
   determining, with a voting procedure, a confidence level for the at least some of the plurality of defects classified with the classifier, wherein the voting procedure includes a vote from each classification output of the classifier;
   identifying a selected number of defects classified by the classifier having the lowest confidence level;
   receiving a signal from the user interface device indicative of an additional manual classification of the selected number of the defects having the lowest confidence level, wherein the classifier comprises a random forest classifier, wherein each tree of the random forest classifier has a classification output that is configured as a vote in the voting procedure; and
   determining whether the additional manual classification identifies one or more additional defect types not identified in the first manual classification.

2. The method of claim 1, further comprising:
   responsive to the identification by the additional manual classification of one or more defect types not identified by the first manual classification, generating an additional classifier based on the first manual classification and the additional manual classification;
   classifying, with the additional classifier, one or more defects not classified by the first manual classification or the additional manual classification;
   identifying a selected number of defects classified by the additional classifier having the lowest-confidence level;
   receiving a signal from the user interface device indicative of a second additional manual classification of the selected number of the defects having the lowest-confidence level; and
   determining whether the second additional manual classification identifies one or more additional defect types not identified in the first manual classification or the additional manual classification.

3. The method of claim 1, further comprising:
   responsive to the determination that the additional manual classification does not identify a defect type not included in the first manual classification, reporting at least the defect types classified by the first manual classification and the defect types classified by the classifier.

4. The method of claim 1, wherein the grouping each of at least a portion of the plurality of defects into one of two or more groups of defect types based on one or more attributes of the defects comprises:
   grouping each of at least a portion of the plurality of defects into one of two or more groups of defect types with a real-time automatic defect classification (RT-ADC) scheme applied to the one or more attributes.

5. The method of claim 1, wherein the random forest classifier comprises:
   at least one of a decision tree classifier or a multiple decision tree classifier.

6. The method of claim 1, wherein the voting procedure comprises a majority two vote scheme.

7. An apparatus for defect classification comprising:
   an inspection tool, the inspection tool including one or more detectors configured to acquire one or more images of at least a portion of a specimen;
   a user interface device; and
   a controller, the controller including one or more processors communicatively coupled to the one or more detectors of the inspection tool, wherein the one or more processors are configured to execute a set of program instructions stored in memory, the set of program instructions configured to cause the one or more processors to:
   receive the one or more images from the one or more detectors of the inspection tool;
   group each of at least a portion of the plurality of defects into one of two or more groups of defect types based on one or more attributes of the defects;
   receive a signal from a user interface device indicative of a first manual classification of a selected number of defects from each of the two or more groups of defect types;
   generate a classifier based on the received first manual classification and the attributes of the defects;
   classify, with the classifier, at least some of the plurality of defects;
   determine, with a voting procedure, a confidence level for the at least some of the plurality of defects classified with the classifier, wherein the voting procedure includes a vote from each classification output of the classifier;
   identify a selected number of defects classified by the classifier having the lowest-confidence level;

receive a signal from the user interface device indicative of an additional manual classification of the selected number of the defects having the lowest-confidence level, wherein the classifier comprises a random forest classifier, wherein each tree of the random forest classifier has a classification output that is configured as a vote in the voting procedure; and determine whether the additional manual classification identifies one or more additional defect types not identified in the first manual classification.

8. The apparatus of claim 7, wherein controller is further configured to:

responsive to the identification by the additional manual classification of one or more defect types not identified by the first manual classification, generate an additional classifier based on the first manual classification and the additional manual classification;

classify, with the additional classifier, one or more defects not classified by the first manual classification or the additional manual classification;

identify a selected number of defects classified by the additional classifier having the lowest confidence level;

receive a signal from the user interface device indicative of a second additional manual classification of the selected number of the defects having the lowest-confidence level; and determine whether the second additional manual classification identifies one or more additional defect types not identified in the first manual classification or the additional manual classification.

9. The apparatus of claim 8, wherein the controller is further configured to:

responsive to the determination that the additional manual classification does not identify a defect type not included in the first manual classification, report at least the defect types classified by the first manual classification and the defect types classified by the classifier.

10. The apparatus of claim 7, wherein the controller is further configured to:

group each of at least a portion of the plurality of defects into one of two or more groups of defect types with a real-time automatic defect classification (RT-ADC) scheme applied to the one or more attributes.

11. The apparatus of claim 8, wherein at least one of the first classifier or the additional classifier comprises:

at least one of a decision tree classifier or a multiple decision tree classifier.

12. The apparatus of claim 7, wherein the controller is further configured to:

calculate a confidence level with a voting procedure that comprises a majority two vote scheme.

13. The apparatus of claim 7, wherein the inspection tool comprises:

an electron beam defect review tool.

14. The apparatus of claim 7, wherein the inspection tool comprises:

a darkfield inspection tool.

15. The apparatus of claim 7, wherein the inspection tool comprises:

a brightfield inspection tool.

16. The apparatus of claim 7, wherein each tree of the random forest classifier has a classification output that is configured as a vote in the voting procedure.

* * * * *